US008482365B2

(12) United States Patent
Taniguchi

(10) Patent No.: US 8,482,365 B2
(45) Date of Patent: Jul. 9, 2013

(54) MULTILAYER BANDPASS FILTER

(75) Inventor: Tetsuo Taniguchi, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/845,844

(22) Filed: Jul. 29, 2010

(65) Prior Publication Data

US 2010/0283557 A1    Nov. 11, 2010

Related U.S. Application Data

(63) Continuation of application No. PCT/JP2009/058660, filed on May 8, 2009.

(30) Foreign Application Priority Data

May 23, 2008    (JP) .................................. 2008-134914

(51) Int. Cl.
*H03H 7/01*    (2006.01)

(52) U.S. Cl.
USPC ......................................................... 333/175

(58) Field of Classification Search
USPC ......... 333/165–168, 174, 175, 185, 202–205, 333/219, 235
See application file for complete search history.

(56) References Cited

U.S. PATENT DOCUMENTS

| 6,759,926 | B2 * | 7/2004 | Yamaguchi | .................... 333/175 |
| 2003/0038689 | A1 | 2/2003 | Yamaguchi | |
| 2003/0048156 | A1 | 3/2003 | Uriu et al. | |
| 2007/0241839 | A1 * | 10/2007 | Taniguchi | ..................... 333/185 |

FOREIGN PATENT DOCUMENTS

| CN | 1192661 C | 3/2005 |
| CN | 1209848 C | 7/2005 |
| EP | 2 009 787 A1 | 12/2008 |
| JP | 3-262313 A | 11/1991 |
| JP | 4-150011 A | 5/1992 |
| JP | 2000-332638 A | 11/2000 |
| JP | 2005-45447 A | 2/2005 |
| WO | 2007/119356 A1 | 10/2007 |

OTHER PUBLICATIONS

Official Communication issued in International Patent Application No. PCT/JP2009/058660, mailed on Aug. 11, 2009.

* cited by examiner

*Primary Examiner* — Benny Lee
*Assistant Examiner* — Gerald Stevens
(74) *Attorney, Agent, or Firm* — Keating & Bennett, LLP

(57) ABSTRACT

A multilayer bandpass filter that is capable of preventing variations in filter characteristics caused by variations in electrode formation, etc., is easily reduced in size, and performs predetermined impedance conversion between an input and an output, includes a first common electrode and a second common electrode disposed on a dielectric layer, and capacitor electrodes are disposed on a dielectric layer. An input/output terminal lead-out electrode is disposed on a dielectric layer, input/output terminal lead-out electrodes are disposed on a dielectric layer, and line electrodes are disposed on a dielectric layer. Via electrodes are formed to establish conduction in the layering direction between individual electrode patterns disposed on the plural dielectric layers. Three LC parallel resonators are constructed with such an arrangement, and respective line lengths of the line electrodes are gradually changed in order to convert the impedance between the input and the output.

14 Claims, 12 Drawing Sheets

MULTILAYER BANDPASS FILTER

BACKGROUND OF THE INVENTION

1. Field of the Invention

The present invention relates to a multilayer bandpass filter in which a plurality of dielectric layers and a plurality of electrode layers are layered on each other.

2. Description of the Related Art

A conventional high-frequency bandpass filter suitable for reduction in size and cost has been constructed by providing a plurality of LC resonators within a laminate in which dielectric layers and electrode layers are layered on each other.

Such a multilayer bandpass filter is disclosed in Japanese Unexamined Patent Application Publication No. 2005-45447.

The construction of the multilayer bandpass filter disclosed in Japanese Unexamined Patent Application Publication No. 2005-45447 will be described with reference to FIG. 1.

FIG. 1 is a circuit diagram of the multilayer bandpass filter disclosed in Japanese Unexamined Patent Application Publication No. 2005-45447. The multilayer bandpass filter 1 includes an unbalanced input terminal 2, balanced output terminals 3A and 3B, and a bandpass filter section 4 disposed between the unbalanced input terminal 2 and the balanced output terminals 3A and 3B. The bandpass filter section 4 includes three resonators 40, which are each defined as a ½-wavelength resonator 41 with both ends being open and which are arranged side by side. Among the three resonators 40, one resonator 40 arranged at a position closest to the unbalanced input terminal serves as an input resonator 401. The unbalanced input terminal 2 is directly connected to the input resonator 401. Another resonator 40 arranged at a position closest to the balanced output terminals 3A and 3B serves as a ½-wavelength resonator 41A for balanced output. The balanced output terminals 3A and 3B are directly connected to the ½-wavelength resonator 41A for balanced output. The input resonator 401 and a middle resonator 40M are electromagnetically coupled to each other, and the middle resonator 40M and the ½-wavelength resonator 41A for balanced output are also electromagnetically coupled to each other. Further, a capacitor C is disposed between each of the open ends of the three resonators 40 and a ground.

In the multilayer bandpass filter disclosed in Japanese Unexamined Patent Application Publication No. 2005-45447, the λ/2 resonators each having both the open ends are arranged on the same substrate surface for coupling between the resonators so as to define filter characteristics.

In the multilayer bandpass filter disclosed in Japanese Unexamined Patent Application Publication No. 2005-45447, however, a degree of coupling between the resonators can be controlled for proper adjustment only by setting the spacing between the resonators in the substrate surface. When strong coupling is to be obtained, the spacing between the resonators needs to be narrowed. Also, the coupling degree varies due to variation in formation of electrodes, etc. This gives rise to a problem that desired filter characteristics are not obtained.

Further, because the shape of the resonator is determined depending on the frequency of the passband, there has also been a limitation in reducing the size of the filter.

In many cases, the balanced terminal side is connected to, e.g., IC input and output signals in the balanced type. In such a case, impedance needs to be converted between the unbalanced terminal and the balanced terminals. With the structure disclosed in Japanese Unexamined Patent Application Publication No. 2005-45447, however, it is not easy to perform setting and adjustment for proper impedance conversion between both the types of terminals.

SUMMARY OF THE INVENTION

Accordingly, preferred embodiments of the present invention solve the above-mentioned problems and provide a multilayer bandpass filter that prevents variations in filter characteristics caused by variations in electrode formation, etc., is easily reduced in size, and performs desired impedance conversion between an input and an output.

A multilayer bandpass filter according to a preferred embodiment of the present invention includes, as an elementary body, a laminate including a plurality of dielectric layers and a plurality of electrode layers each including at least one type of a capacitor electrode and/or an inductor electrode, a plurality of two or more LC parallel resonators each constituted by the capacitor electrode and the inductor electrode, adjacent pairs of the LC parallel resonators being coupled to each other, an input/output terminal lead-out electrode to which is coupled a first LC parallel resonator arranged at one end of the laminate among the plurality of LC parallel resonators and which defines an input portion of the multilayer bandpass filter, and an input/output terminal lead-out electrode to which is coupled a second LC parallel resonator arranged at the other end of the laminate and which serves as an output portion of the multilayer bandpass filter, the inductor electrodes of the plurality of LC parallel resonators are constituted by line electrodes which are disposed on a surface of and/or within the laminate side by side in a direction perpendicular or substantially perpendicular to a layering direction of the laminate, and by via electrodes which are conducted to at least one ends of the line electrodes and which are extended in the layering direction of the laminate, the inductor electrodes are arranged such that surfaces of loops starting from junctions between the via electrodes and the capacitor electrodes and including the line electrodes, respectively, are arrayed side by side in the direction perpendicular or substantially perpendicular to the layering direction of the laminate, the loop surfaces overlapping with each other at least partly when the loop surfaces defined by the inductor electrodes of the LC parallel resonators coupled to each other are viewed in the direction in which the line electrodes are arrayed side by side, and line lengths of the line electrodes are gradually changed from the first LC parallel resonator side toward the second LC parallel resonator side such that impedance conversion is performed between the input portion and the output portion.

Line widths of the line electrodes preferably are gradually changed from the first LC parallel resonator side toward the second LC parallel resonator side. As a result, the impedance conversion between the input and the output can be realized over a wider range.

A portion of at least one of the line electrodes in a longitudinal direction thereof is preferably positioned closer to another adjacent line electrode so that a degree of freedom in coupling between the adjacent resonators can be increased.

At least one of the line electrodes is preferably disposed on the dielectric layer differing from the dielectric layer on which the other one or more line electrodes are disposed such that an area of the loop surface can be easily changed without changing a pattern formed on the dielectric layer.

The capacitor electrode preferably includes at least first and second common electrodes, the first common electrode being conducted to a ground electrode, the second common electrode being not conducted to the ground electrode, the input/output terminal lead-out electrode to which is coupled the first LC parallel resonator is an unbalanced input/output terminal lead-out electrode, and the input/output terminal lead-out electrode to which is coupled the second LC parallel resonator is a pair of balanced input/output terminal lead-out electrodes. Thus, the balance-unbalance conversion function can also be provided.

The balanced input/output terminal lead-out electrodes are preferably arranged respectively at substantially equal distances from a center of the line electrode of the second LC parallel resonator in a longitudinal direction thereof so that a balance characteristic is improved.

The unbalanced input/output terminal lead-out electrode and the balanced input/output terminal lead-out electrodes are preferably disposed respectively on different ones of the dielectric layers so that an input impedance and an output impedance can be set at a high degree of freedom.

The first and second common electrodes are preferably disposed respectively on different ones of the dielectric layers so that an area of the loop surface can be easily changed without changing a pattern formed on the dielectric layer.

The capacitor electrode preferably includes at least the first and second common electrodes, the first common electrode being conducted to the ground electrode, the second common electrode being not conducted to the ground electrode, and the multilayer bandpass filter further includes a via electrode arranged to conduct a central portion of the line electrode of the second LC parallel resonator in a longitudinal direction thereof and the second common electrode to each other.

The power supply terminal is preferably arranged to be led out from the second common electrode such that the power supply terminal for DC feed can be easily provided without using a special dielectric layer.

Input/output terminals, which are connected to the unbalanced input/output terminal lead-out electrode and the balanced input/output terminal lead-out electrodes, and a ground terminal, which is connected to the ground electrode, are preferably arranged on side surfaces of the laminate. As a result, a multilayer bandpass filter can be constructed which can be surface-mounted and which has the balance-unbalance conversion function.

The dielectric layer is preferably made of a low-temperature sintered ceramic so that a capacitance per unit area can be increased and the entire size of the multilayer bandpass filter can be reduced.

The dielectric layer is preferably made of a resin to enable the dielectric layer defining the laminate to have a lower dielectric constant and makes the multilayer bandpass filter adaptable for higher frequency.

According to various preferred embodiments of the present invention, the multilayer bandpass filter can be constructed to be capable of preventing variations in filter characteristics caused by variation in electrode formation, etc., easily reducing its size, and carrying out predetermined impedance conversion between an input and an output.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

A multilayer bandpass filter according to a first preferred embodiment will be described below with reference to FIGS. 2 to 6.

Figure 1:
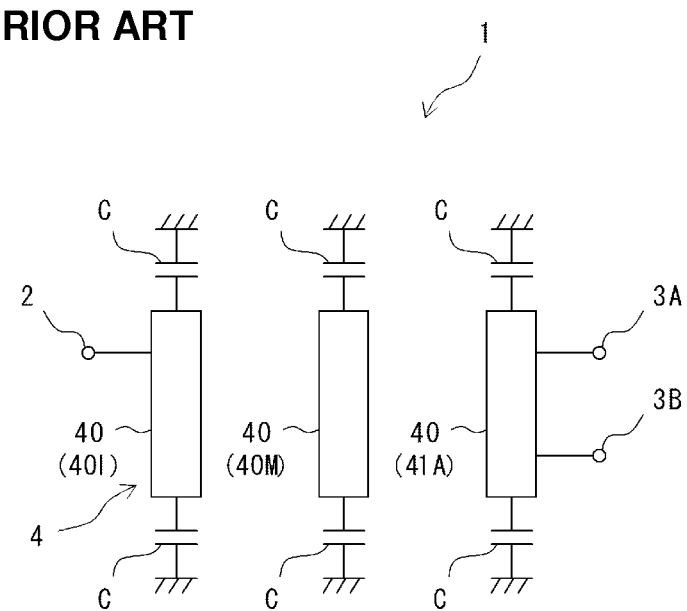
FIG. 1 is a circuit diagram of a multilayer bandpass filter disclosed in Japanese Unexamined Patent Application Publication No. 2005-45447.
Figure 2:
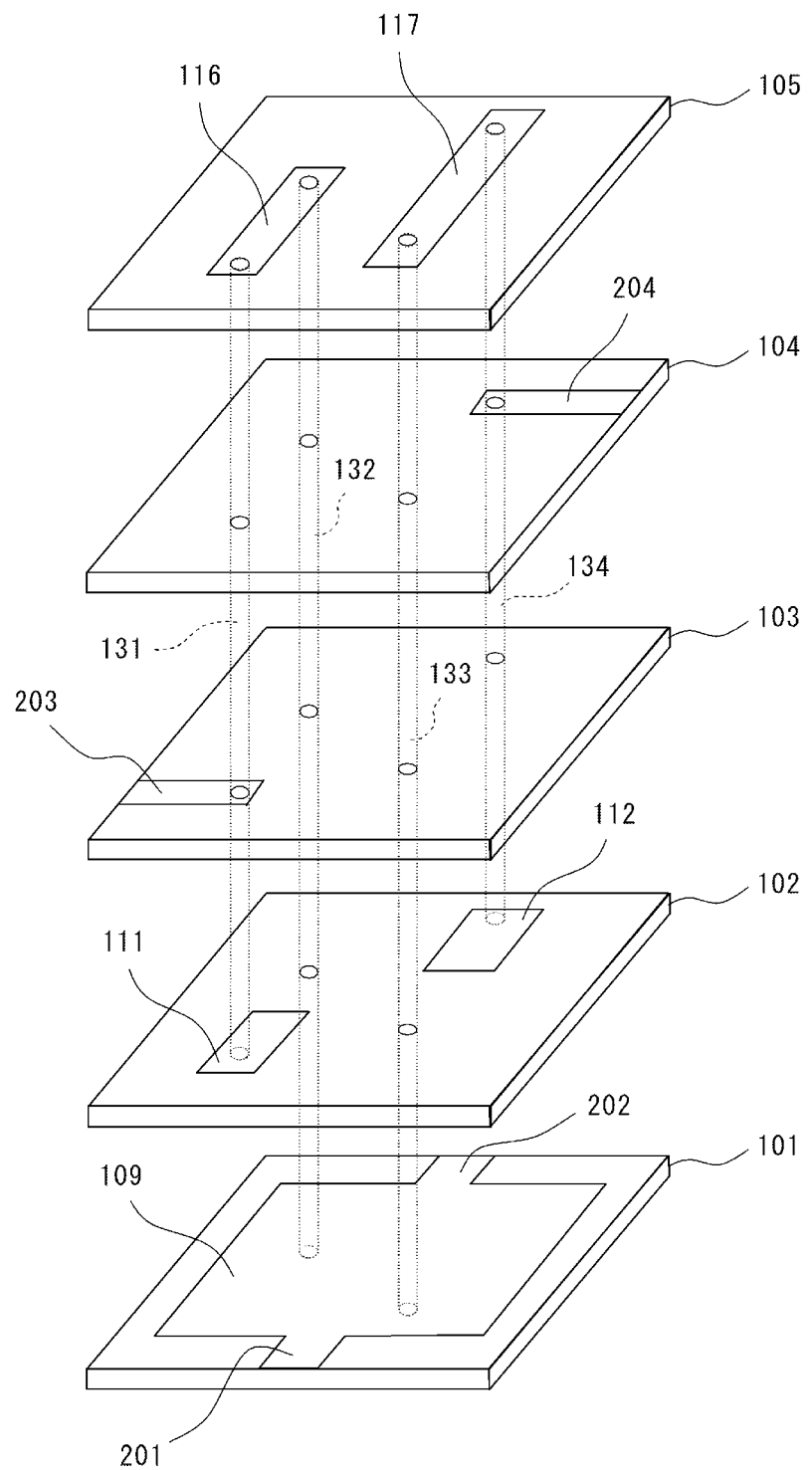
FIG. 2 is an exploded perspective view of a multilayer bandpass filter according to a first preferred embodiment of the present invention.
Figure 3:
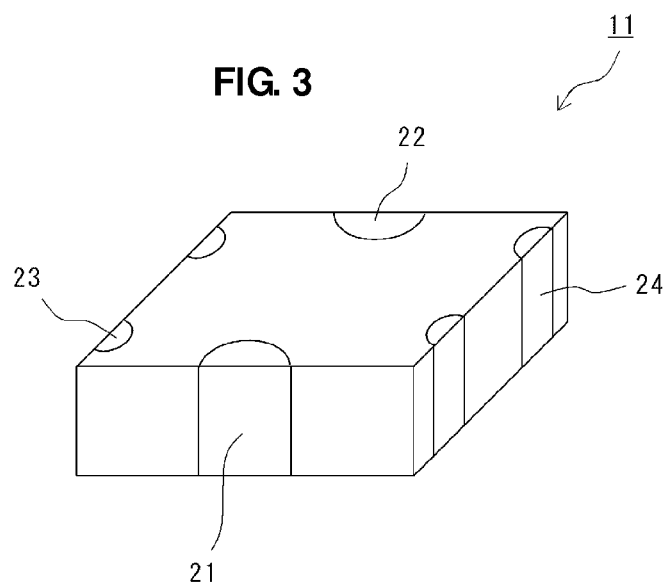
FIG. 3 is a perspective view illustrating an outer appearance of the multilayer bandpass filter according to the first preferred embodiment of the present invention.

FIG. 2 is an exploded perspective view of the multilayer bandpass filter according to the first preferred embodiment, and FIG. 3 is a perspective view illustrating an outer appearance of the multilayer bandpass filter.

As illustrated in FIG. 2, the multilayer bandpass filter according to the first preferred embodiment is constructed by layering a plurality of dielectric layers 101 to 105 on which predetermined electrode patterns are disposed.

A common electrode 109 is disposed on the dielectric layer 101, and capacitor electrodes 111 and 112 are disposed on the dielectric layer 102. An input/output terminal lead-out electrode 203 is disposed on the dielectric layer 103, an input/output terminal lead-out electrode 204 is disposed on the dielectric layer 104, and line electrodes 116 and 117 are disposed on the dielectric layer 105. Further, via electrodes 131 to 134 are arranged to establish conduction in the layering direction between the individual electrode patterns disposed on the plural dielectric layers.

The input/output terminal lead-out electrodes 203 and 204 are led out respectively to one end of the dielectric layer and the other end of the dielectric layer, which is positioned on the side opposite to the one end.

The via electrode 131 is conducted at one end thereof to the capacitor electrode 111 and at the other end thereof to one end of the line electrode 116. Also, the via electrode 131 is conducted at a predetermined position thereof to the input/output terminal lead-out electrode 203.

The via electrode 132 is conducted at one end thereof to the other end of the line electrode 116 and at the other end thereof to the common electrode 109.

The via electrode 133 is conducted at one end thereof to the common electrode 109 and at the other end thereof to one end of the line electrode 117.

The via electrode 134 is conducted at one end thereof to the other end of the line electrode 117 and at the other end thereof to the capacitor electrode 112. Also, the via electrode 134 is conducted at a predetermined position thereof to the input/output terminal lead-out electrode 204.

Further, two ground terminal lead-out electrodes 201 and 202 are arranged to be led out from the common electrode 109.

As illustrated in FIG. 2, starting from a junction between the via electrode 131 and the capacitor electrode 111, a first loop is defined by the via electrodes 131 and 132 and the line electrode 116 so as to extend in the layering direction of the dielectric layers. Similarly, starting from a junction between the via electrode 134 and the capacitor electrode 112, a second loop is defined by the via electrodes 133 and 134 and the line electrode 117 so as to extend in the layering direction of the dielectric layers.

Thus, looking at respective surfaces of loops defined by inductor electrodes of LC parallel resonators in a direction in which the inductor electrodes are arrayed side by side, i.e., as viewed in a direction not only perpendicular to the longitudinal direction of the line electrodes, but also perpendicular to the layering direction of the dielectric layers, the loop surfaces are at least partly overlapped such that the first and second loops are magnetically coupled to each other. Further, respective line lengths of the line electrodes 116 and 117 differ from each other in order to develop a conversion action between the input impedance and the output impedance.

In addition to constructing a laminate of the dielectric layers 101 to 105 on which the various electrode patterns are formed, as illustrated in FIG. 3, unbalanced input/output terminals 23 and 24 are disposed respectively on two opposite side surfaces (end surfaces) among four side surfaces of the laminate, and ground terminals 21 and 22 are disposed on the remaining two side surfaces of the laminate. A multilayer bandpass filter 11 is thereby constructed.

Each of dielectric portions of the dielectric layers 101 to 105 has a specific dielectric constant in the range of 6 to 80. In particular, the dielectric layer 102 generating capacitance has a specific dielectric constant of not smaller than 20. The dielectric layers are each preferably formed by using a low-temperature co-fired ceramic (LTCC) that is made of at least one selected from among titanium oxide, barium oxide, alumina, etc., and a glassy component, for example. As an alternative, each dielectric layer is preferably formed by using a resin, such as a liquid crystal polymer (LCP) or polyimide.

The above-mentioned materials of the dielectric layers are similarly used in other preferred embodiments described below.

Figure 4:
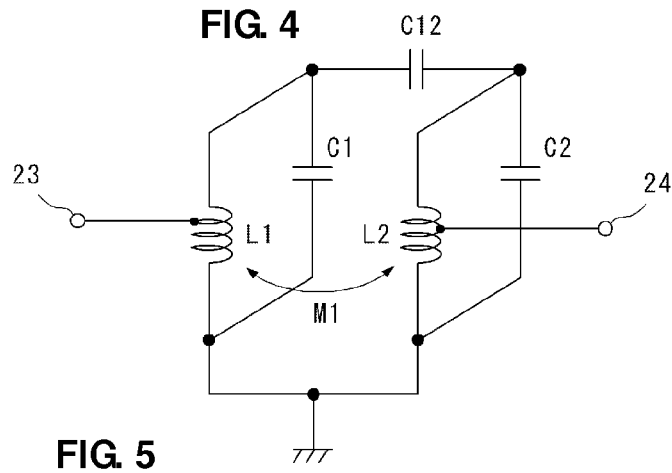
FIG. 4 is an equivalent circuit diagram of the multilayer bandpass filter illustrated in FIGS. 2 and 3.

FIG. 4 is an equivalent circuit diagram of the multilayer bandpass filter illustrated in FIGS. 2 and 3. In FIG. 4, an inductor L1 represents, in a symbolic form, the inductance component generated by an inductor electrode that is constituted by the via electrodes 131 and 132 and the line electrode 116, which are illustrated in FIG. 2.

Similarly, an inductor L2 represents, in a symbolic form, the inductance component generated by an inductor electrode that is constituted by the via electrodes 133 and 134 and the line electrode 117.

Further, a capacitor C1 represents, in a symbolic form, the capacitance generated between the capacitor electrode 111 and the common electrode 109. Similarly, a capacitor C2 represents, in a symbolic form, the capacitance generated between the capacitor electrode 112 and the common electrode 109.

A capacitor C12 represents, in a symbolic form, the stray capacitance generated between the via electrodes 131, 132 and the via electrodes 133, 134 and between the line electrodes 116 and 117.

A first LC parallel resonator is constituted by the inductor L1 and the capacitor C1, which are illustrated in FIG. 4, and a second LC parallel resonator is constituted by the inductor L2 and the capacitor C2.

Operational effects of the above-described impedance conversion and a design method for the same will be described below with reference to FIGS. 5 and 6.

Figure 5:
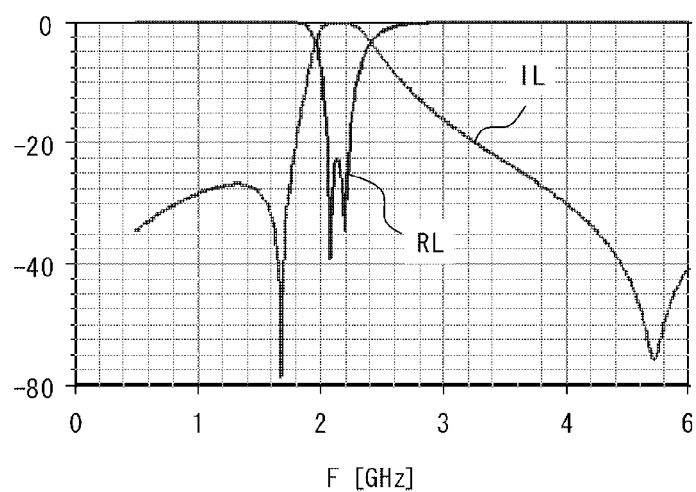
FIG. 5 is a graph plotting characteristics of an insertion loss IL and a reflection loss RL as viewed from one unbalanced input/output terminal when an input impedance and an output impedance are each set to about 50Ω, for example.

FIG. 5 plots characteristics of an insertion loss IL and a reflection loss RL as viewed from one unbalanced input/output terminal (i.e., the input-side terminal) when the capacitance of each of the capacitors C1 and C2 illustrated in FIG. 4 is set to 8 pF, the inductance of each of the inductors L1 and L2 is set to 0.5 nH, a coupling coefficient M between the two LC parallel resonators is set to 0.1, and the input impedance and the output impedance are each set to 50Ω, for example. It should be noted that, when the input impedance and the output impedance are equal to each other as mentioned above, a resulting circuit is symmetrical between the input and the output unlike the example illustrated in FIG. 2.

Figure 6:
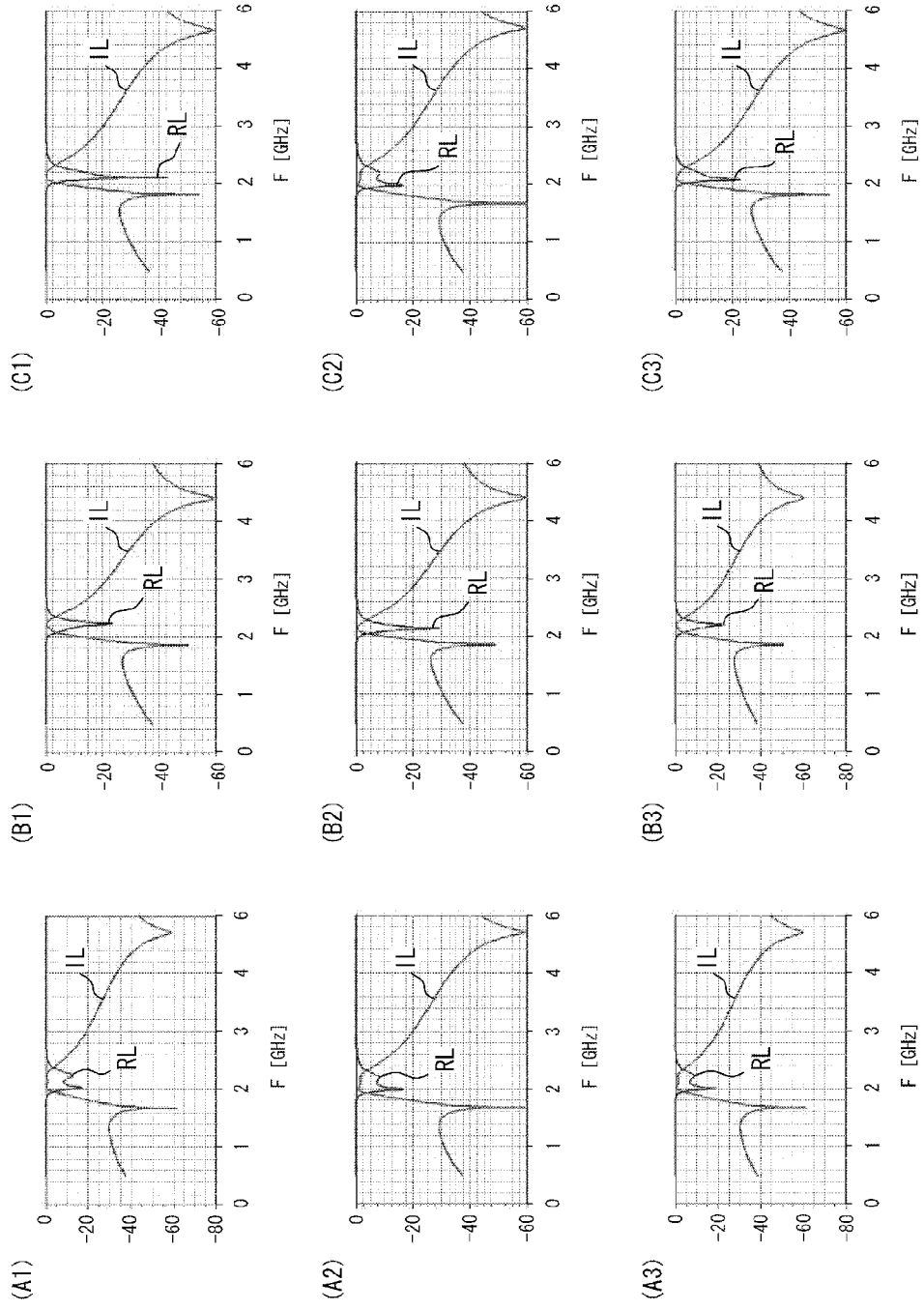
FIGS. 6 (A1), (A2), (A3), (B1), (B2), (B3), (C1), (C2), and (C3) are additional graphs plotting characteristics of an insertion loss IL and a reflection loss RL as viewed from one unbalanced input/output terminal in which the output impedance is changed.

(A1), (A2) and (A3) in FIG. 6 represent examples in which the output impedance is changed while respective capacitances of the capacitors C1 and C2, respective inductances of the inductors L1 and L2, and the coupling coefficient M between the two LC parallel resonators are all held constant. Also, (C1), (C2) and (C3) in FIG. 6 represent examples in which the output impedance is changed while the coupling coefficient M between the two LC parallel resonators is set to a value differing from that set in (A1), (A2) and (A3). Further, (B1), (B2) and (B3) in FIG. 6 represent examples in which the output impedance is changed while the capacitance of the capacitor C2 and the inductance of the inductor L2 of the LC parallel resonator on the output side are set to values differing from those set in (A1), (A2) and (A3). In all the graphs of FIG. 6, the vertical axis represents a loss [dB].

In (A1), (B1) and (C1), the input impedance Zin=50Ω and the output impedance Zout=100Ω are set, for example. Further, (A2), (B2) and (C2) represent changes of the insertion loss IL and the reflection loss RL in the case of Zin=50Ω and Zout=50−J50Ω (1/ωC (reactance)=50Ω), for example. (A3), (B3) and (C3) represent those changes in the case of Zin=50Ω and Zout=100−J50Ω (1/ωC (reactance)=50Ω), for example.

As is apparent from comparison between FIG. 5 and (A1) to (A3) in FIG. 6, the reflection loss RL increases with a deviation of the impedance of a circuit connected to the output of the filter, which has been designed with Zin=50Ω and Zout=50Ω.

Hitherto, the coupling coefficient M between the LC parallel resonators has been adjusted to establish impedance matching in agreement with the impedance required for the circuit which is connected to an output stage of the filter. (C1) to (C3) in FIG. 6 represent the examples in each of which M=0.12 is set.

The impedance matching can be established to some extent by adjusting the coupling coefficient M as described above. As plotted in (C2) of FIG. 6, however, the characteristic of the reflection loss RL is not improved depending on a value of an imaginary portion of the output impedance Zout.

On the other hand, in various preferred embodiments of the present invention, the impedance conversion between the input and the output is performed preferably by properly determining the impedance of the LC parallel resonator. (B1) to (B3) in FIG. 6 represent the examples in which the capacitance of the capacitor C2 of the LC parallel resonator on the output side is set to 10 pF, the inductance of the inductor L2 thereof is set to 0.4 nH, and the coupling coefficient M is held fixed at M=0.1, for example.

As is apparent from comparing (A2), (B2) and (C2) in FIG. 6, the characteristic of the reflection loss RL can be greatly improved by determining the impedance of the output-side resonator depending on a ratio of the capacitor C2 to the inductor L2. Accordingly, the multilayer bandpass filter having the impedance conversion function, which is more superior in the impedance matching characteristic, can be constructed by making the above-described impedance setting of the resonator in addition to the known setting of the coupling coefficient between the resonators.

Second Preferred Embodiment

A multilayer bandpass filter according to a second preferred embodiment will be described below with reference to FIGS. 7 to 9.

While the first preferred embodiment has been described in connection with the multilayer bandpass filter which performs the unbalanced inputting/outputting by preferably using two LC parallel resonators, the second preferred embodiment preferably includes three LC parallel resonators to perform not only the above-described impedance conversion, but also balance-unbalance conversion.

Figure 7:
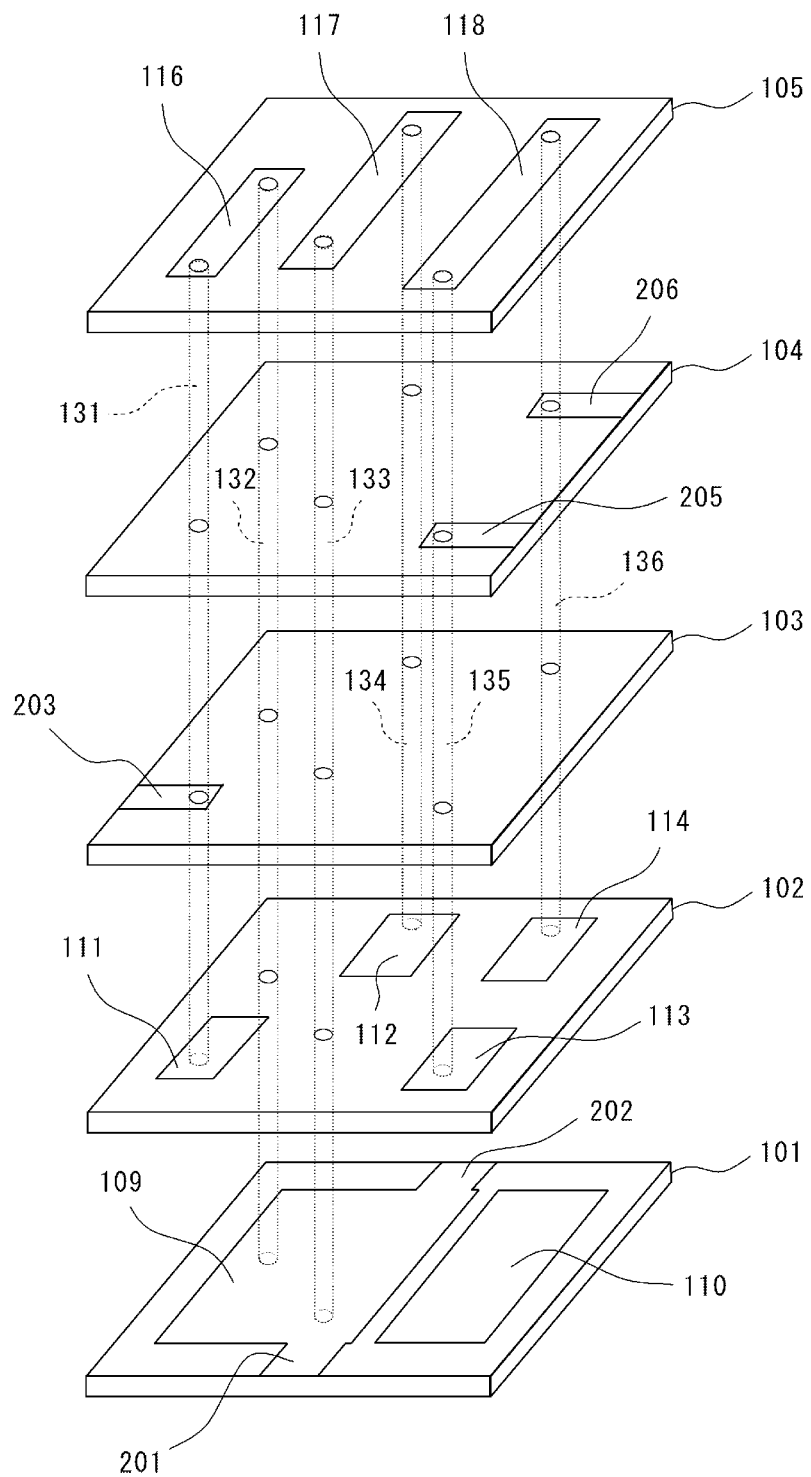
FIG. 7 is an exploded perspective view of a multilayer bandpass filter according to a second preferred embodiment of the present invention.
Figure 8:
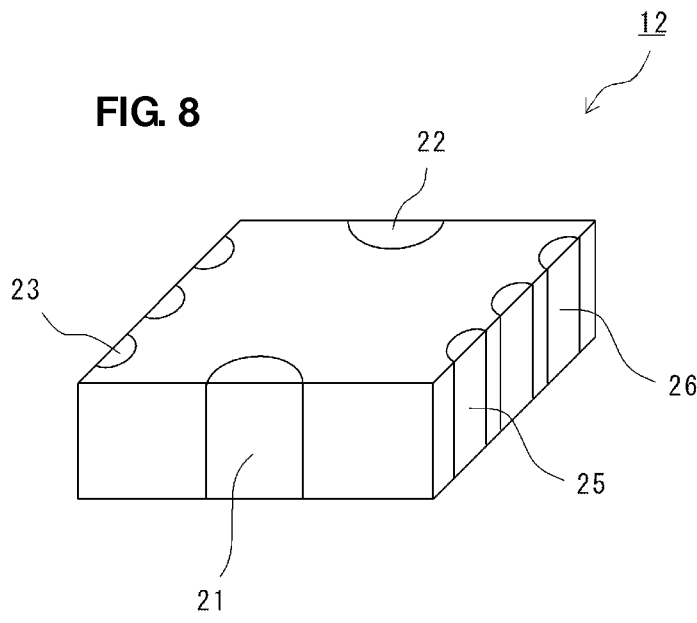
FIG. 8 is a perspective view illustrating an outer appearance of the multilayer bandpass filter according to the second preferred embodiment of the present invention.

FIG. 7 is an exploded perspective view of the multilayer bandpass filter according to the second preferred embodiment, and FIG. 8 is a perspective view illustrating an outer appearance of the multilayer bandpass filter.

As illustrated in FIG. 7, the multilayer bandpass filter according to the second preferred embodiment is constructed by layering a plurality of dielectric layers 101 to 105 on which predetermined electrode patterns are disposed.

A first common electrode 109 and a second common electrode 110 are disposed on the dielectric layer 101, and capacitor electrodes 111, 112, 113 and 114 are disposed on the dielectric layer 102. An input/output terminal lead-out electrode 203 is disposed on the dielectric layer 103, input/output terminal lead-out electrodes 205 and 206 are disposed on the dielectric layer 104, and line electrodes 116, 117 and 118 are disposed on the dielectric layer 105. Further, via electrodes 131 to 136 are arranged to establish conduction in the layering direction between the individual electrode patterns disposed on the plural dielectric layers.

The via electrode 131 is conducted at one end thereof to the capacitor electrode 111 and at the other end thereof to one end of the line electrode 116. Also, the via electrode 131 is conducted at a predetermined position thereof to the input/output terminal lead-out electrode 203.

The via electrode 132 is conducted at one end thereof to the other end of the line electrode 116 and at the other end thereof to the common electrode 109.

The via electrode 133 is conducted at one end thereof to the common electrode 109 and at the other end thereof to one end of the line electrode 117.

The via electrode 134 is conducted at one end thereof to the other end of the line electrode 117 and at the other end thereof to the capacitor electrode 112.

The via electrode 135 is conducted at one end thereof to one end of the line electrode 118 and at the other end thereof to the capacitor electrode 113. Also, the via electrode 135 is conducted at a predetermined position thereof to the input/output terminal lead-out electrode 205.

The via electrode 136 is conducted at one end thereof to the other end of the line electrode 118 and at the other end thereof to the capacitor electrode 114. Also, the via electrode 136 is conducted at a predetermined position thereof to the input/output terminal lead-out electrode 206.

Further, two ground terminal lead-out electrodes 201 and 202 are led out from the common electrode 109.

As illustrated in FIG. 7, starting from a junction between the via electrode 131 and the capacitor electrode 111, a first loop is defined by the via electrodes 131 and 132 and the line electrode 116 so as to extend in the layering direction of the dielectric layers. Similarly, starting from a junction between the via electrode 134 and the capacitor electrode 112, a second loop is defined by the via electrodes 133 and 134 and the line electrode 117 so as to extend in the layering direction of the dielectric layers. Further, starting from a junction between the via electrode 135 and the capacitor electrode 113, a third loop is defined by the via electrodes 135 and 136 and the line electrode 118 so as to extend in the layering direction of the dielectric layers.

Thus, looking at respective surfaces of loops defined by inductor electrodes of LC parallel resonators in a direction in which the inductor electrodes are arrayed side by side, i.e., as viewed in a direction not only perpendicular to the longitudinal direction of the line electrodes, but also perpendicular to the layering direction of the dielectric layers, the loop surfaces are at least partly overlapped such that the first, second and third loops are magnetically coupled to each other. Further, respective line lengths of the line electrodes 116, 117 and 118 differ from each other in order to develop a conversion action between the input impedance and the output impedance. Still further, balance-unbalance conversion is performed as described later.

In addition to constructing a laminate of the dielectric layers 101 to 105 on which the various electrode patterns are disposed, as illustrated in FIG. 8, an unbalanced input/output terminal 23 is disposed on one of two opposite side surfaces (end surfaces) among four side surfaces of the laminate, and balanced input/output terminals 25 and 26 are disposed on the other of the two opposite side surfaces. Ground terminals 21 and 22 are disposed on the remaining two side surfaces of the laminate. A multilayer bandpass filter 12 is thereby constructed.

Figure 9:
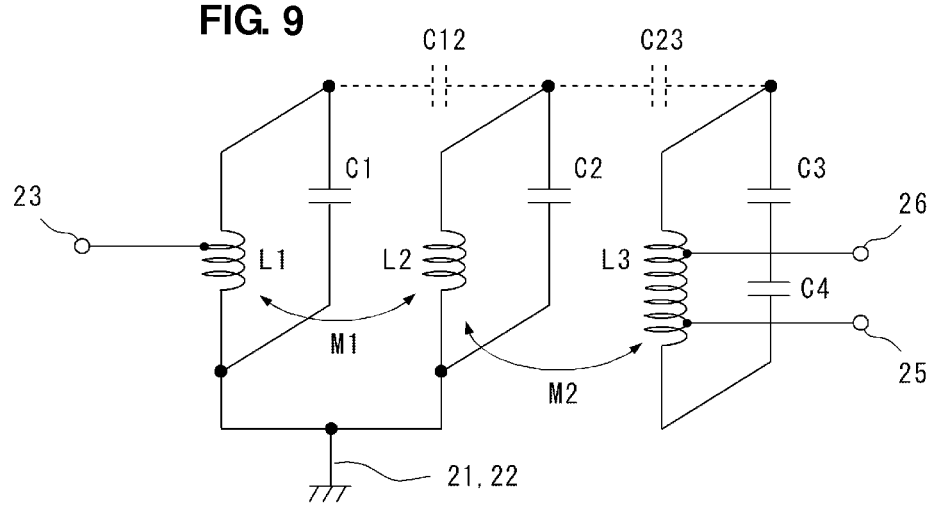
FIG. 9 is an equivalent circuit diagram of the multilayer bandpass filter according to the second preferred embodiment of the present invention.

FIG. 9 is an equivalent circuit diagram of the multilayer bandpass filter illustrated in FIGS. 7 and 8. In FIG. 9, an inductor L1 represents, in a symbolic form, the inductance component generated by an inductor electrode that is constituted by the via electrodes 131 and 132 and the line electrode 116, which are illustrated in FIG. 7. Similarly, an inductor L2 represents, in a symbolic form, the inductance component generated by an inductor electrode that is constituted by the via electrodes 133 and 134 and the line electrode 117.

An inductor L3 represents, in a symbolic form, the inductance component generated by an inductor electrode that is constituted by the via electrodes 135 and 136 and the line electrode 118.

Further, a capacitor C1 represents, in a symbolic form, the capacitance generated between the capacitor electrode 111 and the first common electrode 109. Similarly, a capacitor C2 represents, in a symbolic form, the capacitance generated between the capacitor electrode 112 and the first common electrode 109.

Capacitors C3 and C4 represent, in a symbolic form, the capacitances generated between the capacitor electrodes 113, 114 and the second common electrode 110, respectively.

A capacitor C12 represents, in a symbolic form, the stray capacitance generated between the via electrodes 131, 132 and the via electrodes 133, 134 and between the line electrodes 116 and 117. Similarly, a capacitor C23 represents, in a symbolic form, the stray capacitance generated between the via electrodes 133, 134 and the via electrodes 135, 136 and between the line electrodes 117 and 118.

A first LC parallel resonator is constituted by the inductor L1 and the capacitor C1, which are illustrated in FIG. 9, and a second LC parallel resonator is constituted by the inductor L3 and the capacitors C3 and C4. The inductor L2 and the capacitor C2 constitute a middle LC parallel resonator that is present between the first LC parallel resonator and the second LC parallel resonator.

The first LC parallel resonator and the middle LC parallel resonator are magnetically coupled to each other as indicated by M1, whereas the second LC parallel resonator and the middle LC parallel resonator are magnetically coupled to each other as indicated by M2.

Thus, by setting respective line lengths of the line electrodes 116, 117 and 118 so as to gradually change from the first LC parallel resonator to the second LC parallel resonator, it is possible to eliminate a large impedance change between the adjacent LC parallel resonators, and to reduce the reflection loss.

While electrode widths of the line electrodes 116, 117 and 118 are preferably set substantially constant in the example illustrated in FIG. 7, those electrode widths may be set so as to gradually change from the line electrode 116 of the first LC parallel resonator to the line electrode 118 of the second LC parallel resonator. Since such setting enables the inductance components of the respective inductor electrodes to be gradually changed, the impedance change between the adjacent LC parallel resonators is made gentler and the reflection loss can be further reduced.

Further, the impedance as viewed from the input/output terminal of the first LC parallel resonator can be appropriately determined by leading out the unbalanced input/output terminal lead-out electrode 203 from an intermediate point of the inductor electrode which defines the loop starting from the junction between the via electrode 131 and the capacitor electrode 111, by leading out the balanced input/output terminal lead-out electrode 205 from an intermediate point of the inductor electrode which defines the loop starting from the junction between the via electrode 135 and the capacitor electrode 113, and by leading out the balanced input/output terminal lead-out electrode 206 from an intermediate point of the inductor electrode which defines the loop ending at the junction between the via electrode 136 and the capacitor electrode 114.

Thus, the multilayer bandpass filter can be constructed which can perform the impedance conversion between the input and the output, and which has the unbalance-balance conversion function as well.

Third Preferred Embodiment

A multilayer bandpass filter according to a third preferred embodiment will be described below with reference to FIGS. 10 to 12.

The third preferred embodiment preferably includes the three LC parallel resonators to perform both the impedance conversion and the unbalance-balance conversion function which have been described above, and further includes a power supply terminal for DC feed (hereinafter referred to as a "DC feed terminal").

Figure 10:
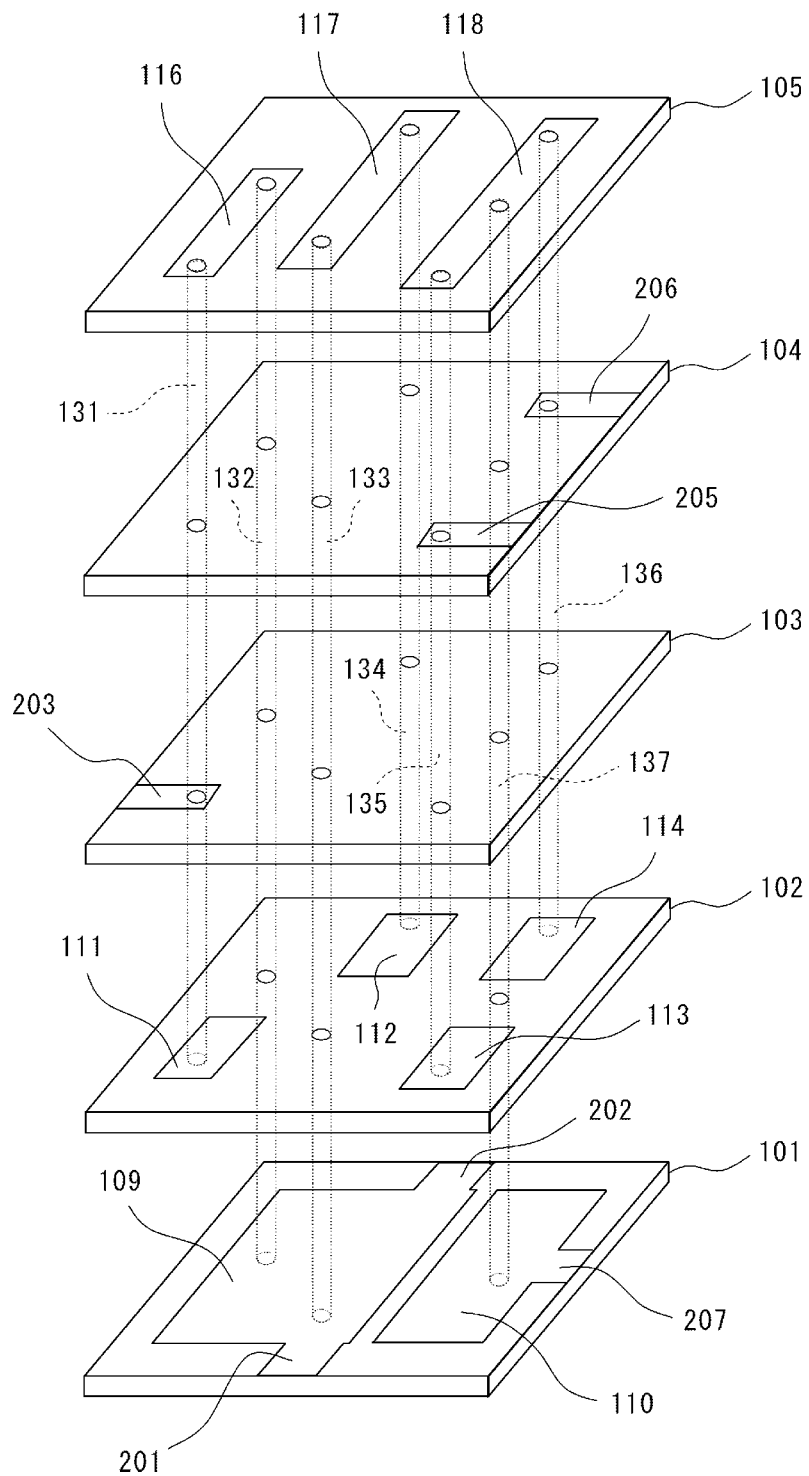
FIG. 10 is an exploded perspective view of a multilayer bandpass filter according to a third preferred embodiment of the present invention.
Figure 11:
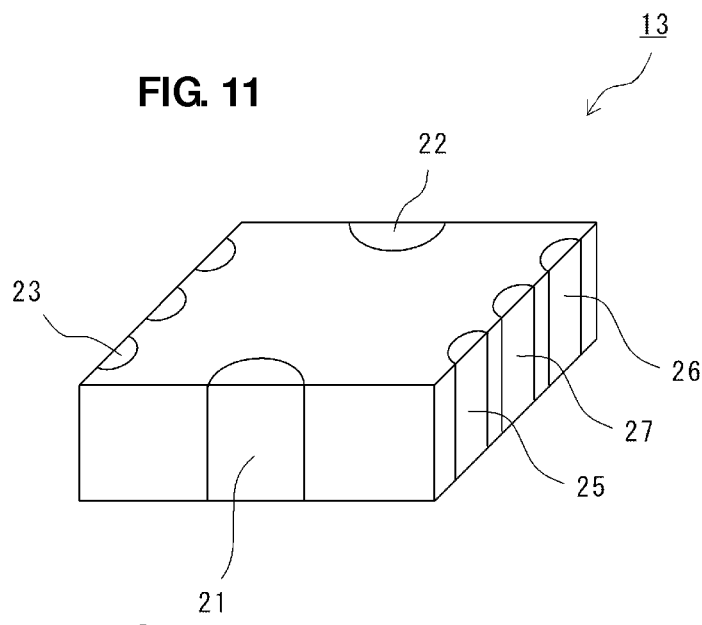
FIG. 11 is a perspective view illustrating an outer appearance of the multilayer bandpass filter according to the third preferred embodiment of the present invention.

FIG. 10 is an exploded perspective view of the multilayer bandpass filter according to the third preferred embodiment, and FIG. 11 is a perspective view illustrating an outer appearance of the multilayer bandpass filter.

In the multilayer bandpass filter according to the third preferred embodiment, unlike the structure of the multilayer bandpass filter according to the second preferred embodiment illustrated in FIG. 7, a center of a line electrode 118 and a second common electrode 110 are connected to each other through a via electrode 137, and a DC feed terminal lead-out electrode 207 is arranged to be led out from the common electrode 110. As illustrated in FIG. 11, an unbalanced input/output terminal 23 is disposed on one of two opposite side surfaces (end surfaces) among four side surfaces of a laminate, and balanced input/output terminals 25 and 26 and a DC feed terminal 27 are disposed on the other of the two opposite side surfaces. Ground terminals 21 and 22 are disposed on the remaining two side surfaces of the laminate. A multilayer bandpass filter 13 is thereby constructed.

Figure 12:
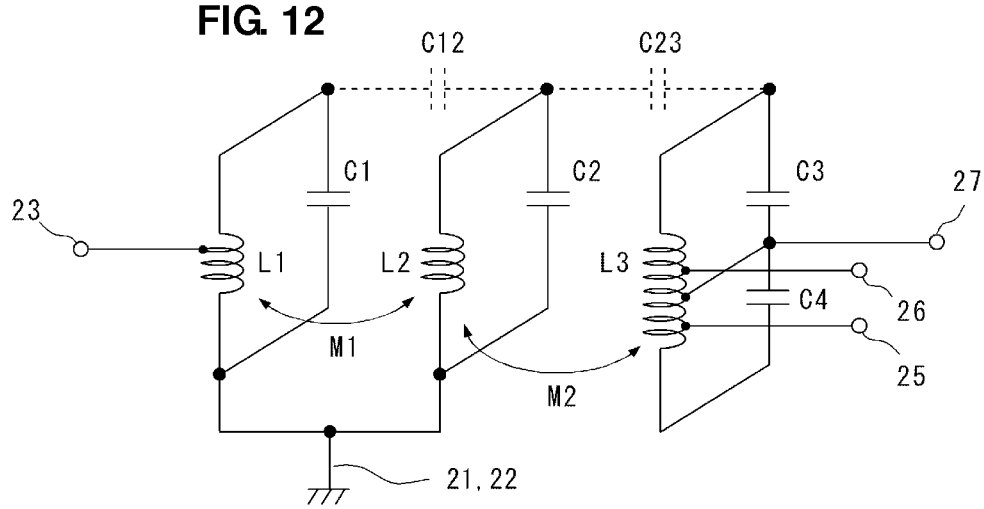
FIG. 12 is an equivalent circuit diagram of the multilayer bandpass filter according to the third preferred embodiment of the present invention.

FIG. 12 is an equivalent circuit diagram of the multilayer bandpass filter illustrated in FIGS. 10 and 11. The circuit illustrated in FIG. 12 differs from the circuit illustrated in FIG. 9 in that a center of an inductor L3 is connected to a junction between capacitors C3 and C4, and that the DC feed terminal 27 is led out from the junction between the capacitors C3 and C4.

Thus, the multilayer bandpass filter can be constructed which can perform the impedance conversion between the input and the output, and which has the unbalance-balance conversion function as well. In addition, a bias voltage can be applied from the DC feed terminal 27 to a differential amplification circuit (IC chip) that is connected to the balanced input/output terminals 25 and 26.

Fourth Preferred Embodiment

A multilayer bandpass filter according to a fourth preferred embodiment will be described with reference to FIGS. 13 to 15.

The fourth preferred embodiment preferably includes the three LC parallel resonators to perform both the impedance conversion and unbalance-balance conversion function, and further includes a capacitor between a DC feed terminal and a ground.

Figure 13:
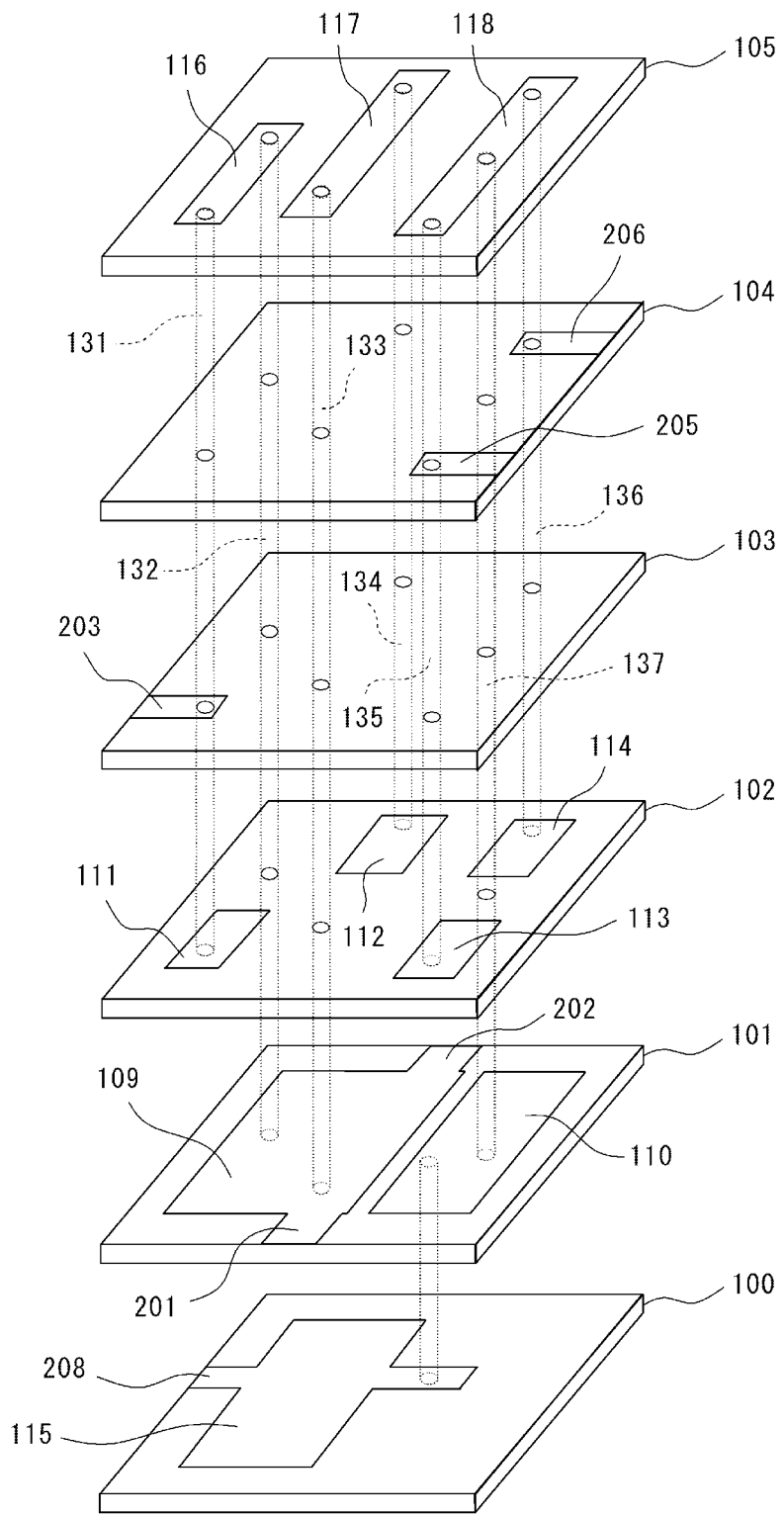
FIG. 13 is an exploded perspective view of a multilayer bandpass filter according to a fourth preferred embodiment of the present invention.
Figure 14:
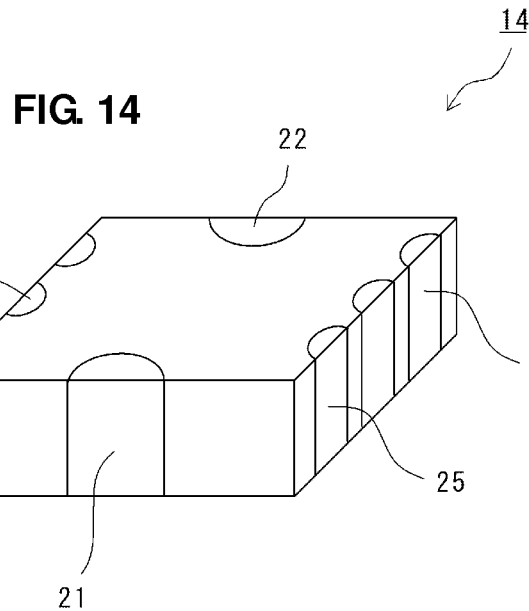
FIG. 14 is a perspective view illustrating an outer appearance of the multilayer bandpass filter according to the fourth preferred embodiment of the present invention.

FIG. 13 is an exploded perspective view of the multilayer bandpass filter according to the fourth preferred embodiment, and FIG. 14 is a perspective view illustrating an outer appearance of the multilayer bandpass filter.

In the fourth preferred embodiment illustrated in FIG. 13, unlike the structure of the multilayer bandpass filter according to the third preferred embodiment illustrated in FIG. 10, a dielectric layer 100 is disposed with a capacitor electrode 115 and a DC feed terminal lead-out electrode 208 disposed on the dielectric layer 100, and the capacitor electrode 115 and the second common electrode 110 are conducted to each other through a via electrode.

As illustrated in FIG. 14, an unbalanced input/output terminal 23 and a DC feed terminal 28 are disposed on one of two opposite side surfaces (end surfaces) among four side surfaces of a laminate, and balanced input/output terminals 25 and 26 are disposed on the other of the two opposite side surfaces. Ground terminals 21 and 22 are disposed on the remaining two side surfaces of the laminate. A multilayer bandpass filter 14 is thereby constructed.

Figure 15:
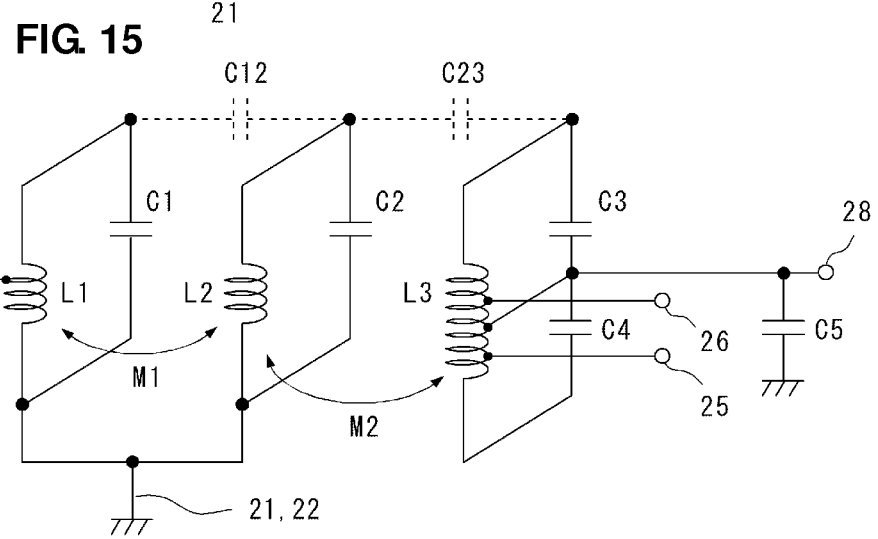
FIG. 15 is an equivalent circuit diagram of the multilayer bandpass filter according to the fourth preferred embodiment of the present invention.

In FIG. 15, a capacitor C5 represents the capacitance generated between the capacitor electrode 115 and the first common electrode 109, which are illustrated in FIG. 13.

Thus, with the capacitor C5 disposed between the DC feed terminal and the ground, a high-frequency signal can be prevented from being input to the DC feed terminal 28.

Fifth Preferred Embodiment

Figure 16:
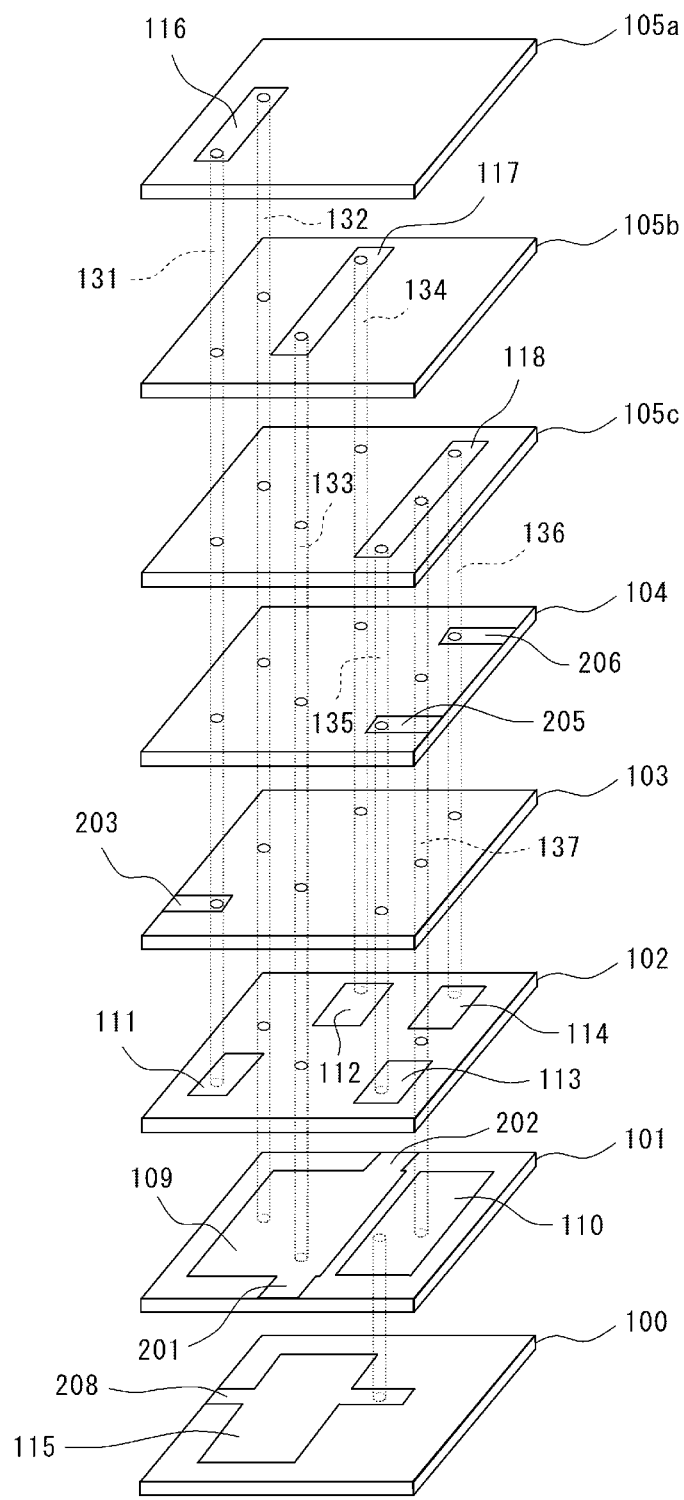
FIG. 16 is an exploded perspective view of a multilayer bandpass filter according to a fifth preferred embodiment of the present invention.

In FIG. 16, a line electrode 116 is disposed on a dielectric layer 105a, a line electrode 117 is disposed on a dielectric layer 105b, and a line electrode 118 is disposed on a dielectric layer 105c. Stated another way, the line electrodes serving as portions of respective inductor electrodes of three LC parallel resonators are disposed on different dielectric layers. The other construction according to a fifth preferred embodiment is similar to that in the fourth preferred embodiment.

With such a construction, since a loop area of the inductor electrode, which is defined by the via electrodes and the line electrode of each LC parallel resonator, can be determined as appropriate, a desired impedance can be set at a higher degree of freedom. Furthermore, the loop area can be arbitrarily set just by forming the line electrodes on different (changed) ones of the dielectric layers and changing the number and the thicknesses of dielectric layers which are additionally inserted between the above-described dielectric layers, while respective patterns of the line electrodes 116, 117 and 118 are kept the same. As a result, dielectric sheets can be used in common and the manufacturing cost can be greatly cut with no necessity of forming a different electrode pattern for each of filters having different characteristics.

Sixth Preferred Embodiment

Figure 17:
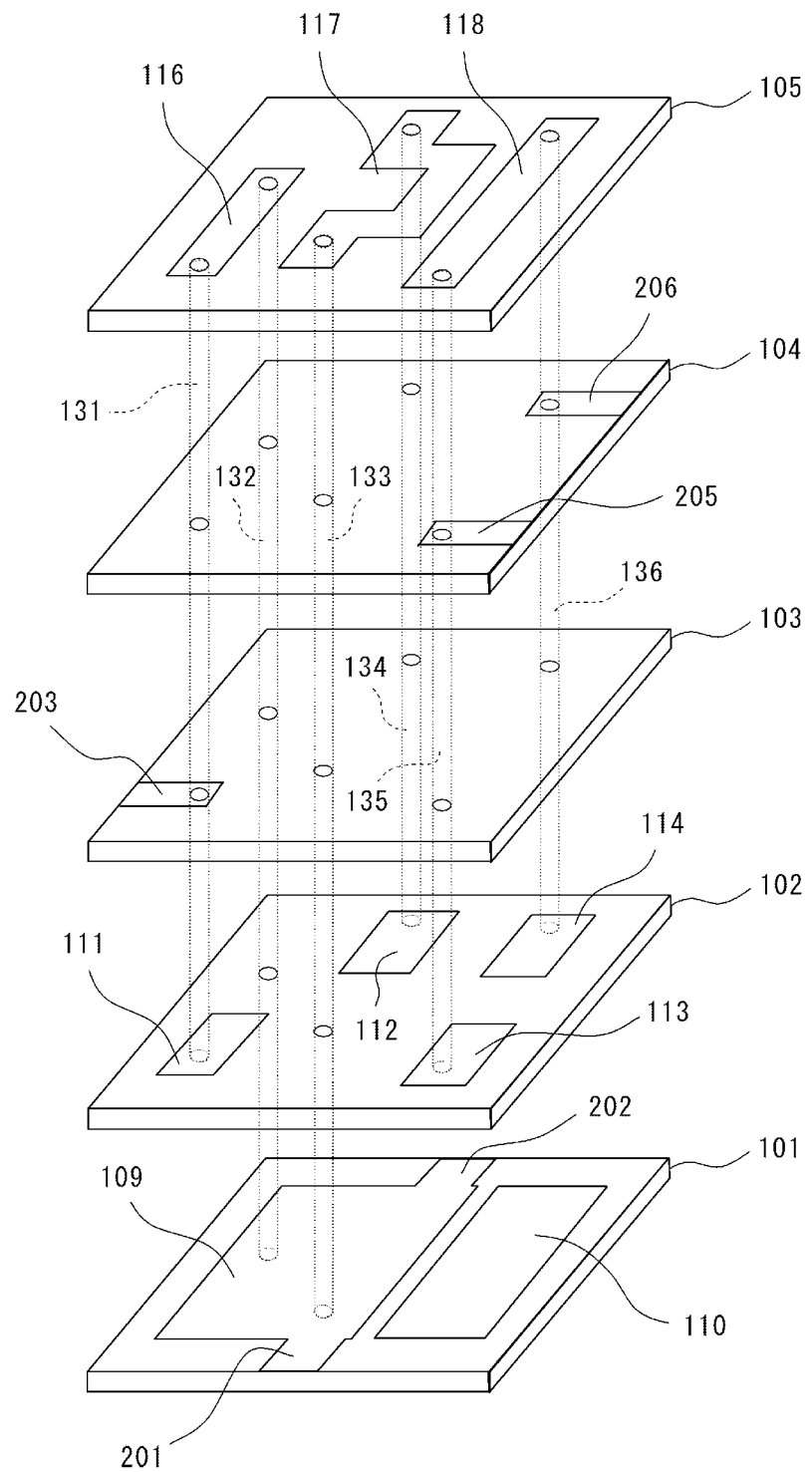
FIG. 17 is an exploded perspective view of a multilayer bandpass filter according to a sixth preferred embodiment of the present invention.

FIG. 17 is an exploded perspective view of a multilayer bandpass filter according to a sixth preferred embodiment. In the sixth preferred embodiment, unlike the second preferred embodiment illustrated in FIG. 7, the line electrode 117 includes a bent portion such that the bent portion of the line electrode 117 comes closer to the adjacent line electrode 118. Such a structure can increase the coupling degree between the LC parallel resonator including the inductor electrode, which is formed by the via electrodes 133 and 134 and the line electrode 117, and the LC parallel resonator including the inductor electrode, which is defined by the via electrodes 135 and 136 and the line electrode 118.

Thus, the reflection loss can be reduced by determining not only the impedance of each resonator, but also the coupling coefficient between the adjacent resonators as described above.

While the line electrodes constituting portions of the respective inductor electrodes of the plural LC parallel resonators are disposed on the surface of the laminate in the above-described preferred embodiments, those inductor electrodes may be all disposed inside the laminate.

Further, the first and second common electrodes may be disposed on different ones of the above-described dielectric layers such that the inductances of the inductor electrodes are set to predetermined values.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A multilayer bandpass filter comprising:
an elementary body including a laminate including a plurality of dielectric layers and a plurality of electrode layers each including at least one of a capacitor electrode and an inductor electrode, wherein a plurality of LC parallel resonators are each constituted by the corresponding capacitor electrode and the corresponding inductor electrode, and adjacent pairs of the plurality of LC parallel resonators being coupled to each other;
a first input/output terminal lead-out electrode to which is coupled a first LC parallel resonator among the plurality of LC parallel resonators arranged at one end of the laminate and which defines an input portion of the multilayer bandpass filter; and
a second input/output terminal lead-out electrode to which is coupled a second LC parallel resonator among the plurality of LC parallel resonators arranged at the other end of the laminate and which defines an output portion of the multilayer bandpass filter; wherein
the inductor electrodes of the plurality of LC parallel resonators are constituted by line electrodes which are disposed on a surface of and/or within the laminate side by side in a direction perpendicular or substantially perpendicular to a layering direction of the laminate, and by via electrodes which are connected to corresponding ends of the line electrodes and which are extended in the layering direction of the laminate;
the inductor electrodes are respectively arranged such that surfaces of loops starting from junctions between the via electrodes and the capacitor electrodes and including the line electrodes are arrayed side by side in the direction perpendicular or substantially perpendicular to the layering direction of the laminate, the loop surfaces overlapping with each other at least partly when the loop surfaces defined by the inductor electrodes of the plurality of LC parallel resonators coupled to each other are viewed in the direction in which the line electrodes are arrayed side by side;
the line electrode of the first LC parallel resonator is directly electrically and physically connected to the first input/output terminal lead-out electrode and the line electrode of the second LC parallel resonator is directly electrically and physically connected to the second input/output terminal lead-out electrode; and
a line length of the line electrode of the first LC parallel resonator directly electrically and physically connected to the first input/output terminal lead-out electrode is different from a line length of the line electrode of the second LC parallel resonator directly electrically and physically connected to the second input/output terminal lead-out electrode such that impedance conversion is performed between the input portion and the output portion.

2. The multilayer bandpass filter according to claim 1, wherein a line width of the line electrode of the first LC parallel resonator is different from a line width of the line electrode of the second LC parallel resonator.

3. The multilayer bandpass filter according to claim 1, wherein a portion of at least one of the line electrodes in a longitudinal direction thereof is positioned closer to another adjacent line electrode.

4. The multilayer bandpass filter according to claim 1, wherein at least one of the line electrodes is disposed on a differing one of the plurality of dielectric layers than the dielectric layer on which the other one or more line electrodes are disposed.

5. The multilayer bandpass filter according to claim 1, wherein each capacitor electrode includes at least first and second common electrodes, the first common electrode being conducted to a ground electrode, the second common electrode being not conducted to the ground electrode, the input/output terminal lead-out electrode coupled to the first LC parallel resonator is an unbalanced input/output terminal lead-out electrode, and the input/output terminal lead-out electrode coupled to the second LC parallel resonator is a pair of balanced input/output terminal lead-out electrodes.

6. The multilayer bandpass filter according to claim 5, wherein the balanced input/output terminal lead-out electrodes are arranged respectively at substantially equal distances from a center of the line electrode of the second LC parallel resonator in a longitudinal direction thereof.

7. The multilayer bandpass filter according to claim 5, wherein the unbalanced input/output terminal lead-out electrode and the balanced input/output terminal lead-out electrodes are disposed respectively on different ones of the plurality of dielectric layers.

8. The multilayer bandpass filter according to claim 5, wherein the first and second common electrodes are disposed respectively on different ones of the plurality of dielectric layers.

9. The multilayer bandpass filter according to claim 5, wherein the multilayer bandpass filter further includes a via electrode arranged to conduct a central portion of the line electrode of the second LC parallel resonator in a longitudinal direction thereof and the second common electrode to each other.

10. The multilayer bandpass filter according to claim 9, wherein a power supply terminal lead-out electrode is arranged to be led out from the second common electrode.

11. The multilayer bandpass filter according to claim 5, wherein input/output terminals, which are connected to the unbalanced input/output terminal lead-out electrode and the balanced input/output terminal lead-out electrodes, and a ground terminal, which is connected to the ground electrode, are arranged on side surfaces of the laminate.

12. The multilayer bandpass filter according to claim 1, wherein the plurality of dielectric layers are made of a low-temperature sintered ceramic.

13. The multilayer bandpass filter according to claim 1, wherein the plurality of dielectric layers are made of a resin.

14. The multilayer bandpass filter according to claim 1, wherein the plurality of LC parallel resonators includes at least three LC parallel resonators, and line lengths of the line electrodes of the at least three LC parallel resonators incrementally increases from a side of the first LC parallel resonator to a side of the second LC parallel resonator.

* * * * *